(12) United States Patent
Fukuda et al.

(10) Patent No.: US 10,833,246 B2
(45) Date of Patent: Nov. 10, 2020

(54) PIEZOELECTRIC SENSOR FOR BICYCLE COMPONENT

(71) Applicant: Shimano Inc., Sakai (JP)

(72) Inventors: Masahiko Fukuda, Sakai (JP); Yoshiyuki Watanabe, Takasaki (JP); Takaya Masuda, Sakai (JP)

(73) Assignee: SHIMANO INC., Sakai (JP)

(*) Notice: Subject to any disclaimer, the term of this patent is extended or adjusted under 35 U.S.C. 154(b) by 607 days.

(21) Appl. No.: 15/687,550

(22) Filed: Aug. 28, 2017

(65) Prior Publication Data

US 2017/0358731 A1 Dec. 14, 2017

Related U.S. Application Data

(62) Division of application No. 14/814,514, filed on Jul. 31, 2015, now Pat. No. 9,773,966.

(51) Int. Cl.
*H01L 41/113* (2006.01)
*B62M 3/00* (2006.01)
*B62M 3/08* (2006.01)
*B62J 99/00* (2020.01)
*H01L 41/047* (2006.01)
*H01L 41/18* (2006.01)
*H02N 2/18* (2006.01)
*B62J 45/00* (2020.01)
*B62J 45/40* (2020.01)

(52) U.S. Cl.
CPC .......... *H01L 41/1132* (2013.01); *B62J 99/00* (2013.01); *B62M 3/00* (2013.01); *B62M 3/08* (2013.01); *H01L 41/047* (2013.01); *H01L 41/183* (2013.01); *H02N 2/18* (2013.01); *B62J 45/00* (2020.02); *B62J 45/40* (2020.02)

(58) Field of Classification Search
CPC . H01L 41/1132; H01L 41/047; H01L 41/183; B62J 99/00; B62M 3/00; B62M 3/08; H02N 2/18; B52J 2099/002; B52K 2207/00
USPC .................................................. 310/339, 358
See application file for complete search history.

(56) References Cited

U.S. PATENT DOCUMENTS

| 4,849,668 | A | * | 7/1989 | Crawley | ............... H01L 41/053 310/328 |
|---|---|---|---|---|---|
| 5,245,734 | A | | 9/1993 | Issartel | |
| 5,320,910 | A | | 6/1994 | Banno et al. | |
| 5,852,337 | A | | 12/1998 | Takeuchi et al. | |
| 6,150,456 | A | | 11/2000 | Lee et al. | |
| 7,861,599 | B2 | | 1/2011 | Meggiolan | |

(Continued)

FOREIGN PATENT DOCUMENTS

| DE | 4435174 A1 | 3/1996 |
|---|---|---|
| DE | 69714909 T2 | 4/2003 |

(Continued)

OTHER PUBLICATIONS

U.S. Office Action dated Feb. 15, 2017 issued in U.S. Appl. No. 14/814,514.

(Continued)

*Primary Examiner* — Thomas M Dougherty

(57) ABSTRACT

A piezoelectric material contains ferroelectric particles and an adhesive resin. The ratio of the ferroelectric particles relative to the total mass of the ferroelectric particles and the adhesive resin is 40 mass % or greater and 98 mass % or less.

10 Claims, 6 Drawing Sheets

(56) References Cited

U.S. PATENT DOCUMENTS

| | | |
|---|---|---|
| 8,006,574 B2 | 8/2011 | Meyer |
| 8,011,242 B2 | 9/2011 | O'Neill et al. |
| 8,327,723 B2 | 12/2012 | Roudergues et al. |
| 8,700,114 B2 | 4/2014 | Gottlieb et al. |
| 9,773,966 B2 * | 9/2017 | Fukuda ............... B62M 3/00 |
| 10,377,444 B2 * | 8/2019 | Suzuki ............... B62M 6/50 |
| 2003/0030249 A1 | 2/2003 | Lammer |
| 2004/0109298 A1 | 6/2004 | Hartman et al. |
| 2006/0017353 A1 * | 1/2006 | Sakai ............... H01L 41/113 |
| | | 310/339 |
| 2006/0046320 A1 | 3/2006 | Sunahara et al. |
| 2007/0138980 A1 | 6/2007 | Sanders et al. |
| 2008/0179993 A1 | 7/2008 | Sanderson |
| 2010/0263468 A1 | 10/2010 | Fisher et al. |
| 2011/0281172 A1 | 11/2011 | Yong et al. |
| 2012/0166105 A1 | 6/2012 | Biermann et al. |
| 2012/0210784 A1 | 8/2012 | Kokkoneva et al. |
| 2012/0214646 A1 | 8/2012 | Lull et al. |
| 2012/0330572 A1 | 12/2012 | Longman |
| 2013/0019700 A1 | 1/2013 | Matsumoto |
| 2013/0104650 A1 | 5/2013 | Bailey et al. |
| 2013/0197744 A1 | 8/2013 | Tuulari et al. |
| 2013/0205916 A1 | 8/2013 | Kodama et al. |
| 2013/0210583 A1 | 8/2013 | Kametani et al. |
| 2015/0145375 A1 * | 5/2015 | Sakaguchi ......... H01L 41/1136 |
| | | 310/321 |
| 2016/0001556 A1 * | 1/2016 | Masuda ............... B41J 2/14201 |
| | | 347/71 |

FOREIGN PATENT DOCUMENTS

| | | |
|---|---|---|
| DE | 10158600 A1 | 6/2003 |
| DE | 102011006637 A1 | 10/2012 |
| EP | 1978342 A2 | 10/2008 |
| EP | 2477881 | 7/2012 |
| JP | 2008151638 A | 7/2008 |
| WO | 2009083787 A1 | 7/2009 |
| WO | 2010014242 A1 | 2/2010 |
| WO | 2010014964 A2 | 2/2010 |
| WO | 2010088888 A2 | 8/2010 |
| WO | 2011030215 A1 | 3/2011 |
| WO | 2012056510 A1 | 5/2012 |
| WO | 2012056522 A1 | 5/2012 |
| WO | 2013017465 A2 | 2/2013 |
| WO | 2016017632 A1 | 2/2016 |

OTHER PUBLICATIONS

"A piezopaint-based sensor for monitoring structure dynamics", Lahtinen et al., Oct. 31, 2007, IOP Science, Smart Mater. Struct. 16 2571, pp. 1-17.

* cited by examiner

PIEZOELECTRIC SENSOR FOR BICYCLE COMPONENT

CROSS-REFERENCE TO RELATED APPLICATIONS

This application is a divisional of U.S. patent application Ser. No. 14/814,514, which is based upon and claims the benefit of priority from prior U.S. patent application Ser. No. 14/479,379, filed on Sep. 8, 2014, the entire contents of which are incorporated herein by reference.

TECHNICAL FIELD

The present invention relates to a piezoelectric material, a piezoelectric sensor including the piezoelectric material, a bicycle component including a piezoelectric sensor, a bicycle crankshaft, a bicycle crank arm, and a method for manufacturing a piezoelectric material.

BACKGROUND ART

A piezoelectric element (piezo element) that generates electric power when mechanical force is applied thereto is widely known. EP1978342 discloses an example of a piezoelectric element arranged in a crank assembly of a bicycle to detect the force applied to the crank assembly.

SUMMARY

It is an object of the present invention to provide a piezoelectric material, a piezoelectric sensor including the piezoelectric material, a bicycle component including a piezoelectric sensor, a bicycle crankshaft, a bicycle crank arm, and a method for manufacturing a piezoelectric material.

One aspect of the present invention provides a piezoelectric material comprising ferroelectric particles and an adhesive resin. The ratio of the ferroelectric particles relative to the total mass of the ferroelectric particles and the adhesive resin is 40 mass % or greater and 98 mass % or less.

In some implementations, the ratio of the ferroelectric particles relative to the total ratio of the ferroelectric particles relative to a total mass of the ferroelectric particles and the adhesive resin is 40 mass % or greater and 90 mass % or less.

In some implementations, the ratio of the ferroelectric particles relative to the total mass of the ferroelectric particles and the adhesive resin is 80 mass % or less.

In some implementations, an average particle diameter of the ferroelectric particles is 2 μm or greater and 10 μm or less.

In some implementations, the ferroelectric particles are formed by sintering and then pulverizing a resulting sinter.

In some implementations, the piezoelectric material has a thickness of 20 μm or greater and 200 μm or less.

A further aspect of the present invention provides a piezoelectric sensor includes the piezoelectric material and two electrodes coupled to the piezoelectric material.

In some implementations, the two electrodes include an outer electrode coupled to an outer surface of the piezoelectric material and an inner electrode coupled to an inner surface of the piezoelectric material to sandwich the piezoelectric material therebetween.

In some implementations, the inner electrode includes a plurality of inner sub-electrodes that are spaced apart by gaps from one another.

In some implementations, the outer electrode includes a plurality of outer sub-electrodes that are spaced apart by gaps from one another.

A piezoelectric sensor according to a certain embodiment includes the piezoelectric material noted above, and one or more output electrodes coupled to an outer surface of the piezoelectric material.

In some implementations, the one or more output electrodes includes a plurality of outer sub-electrodes that are spaced apart by gaps from one another.

In some implementations, the piezoelectric material includes an inner surface serving as a coupling surface to an article to be sensed.

A further aspect of the present invention provides a bicycle component that includes the piezoelectric sensor.

A further aspect of the present invention provides a bicycle crankshaft on which the piezoelectric sensor is arranged.

A further aspect of the present invention provides a bicycle pedal shaft on which the piezoelectric sensor is arranged.

A further aspect of the present invention provides a bicycle crank arm on which the piezoelectric sensor is arranged.

A further aspect of the present invention provides a bicycle component including a ferroelectric film having power generating characteristics.

In some implementations, the ferroelectric film includes a mixture of ferroelectric particles and an adhesive resin.

In some implementations, the ratio of the ferroelectric particles relative to the total mass of the ferroelectric particles and the adhesive resin in the ferroelectric film is 40 mass % or greater and 90 mass % or less.

In some implementations, the bicycle component includes an insulation film formed on a surface of a main body of the bicycle component, a first electrode formed on the insulation film, the ferroelectric film connected to the first electrode, and a second electrode connected to the ferroelectric film.

In some implementations, the bicycle component includes a shaft body, an insulation film formed on a surface of the shaft body, a plurality of output electrodes spaced apart by gaps from one another and arranged on the insulation film around the shaft body, and the ferroelectric film connected to the output electrodes. The gaps between adjacent ones of the output electrodes are filled with the ferroelectric film. A common electrode is connected to the ferroelectric film.

In some implementations, the shaft body is selected from a group consisting of a crankshaft, a crank arm, a pedal shaft, a frame, a handle, a stem, a hub axle, a hub shell, a spoke, a seat post, and a saddle rail.

In some implementations, the ferroelectric film includes an inner surface and an outer surface that are substantially parallel to the shaft body. The output electrodes are in close contact with the inner surface of the ferroelectric film, and the common electrode is in close contact with the outer surface of the ferroelectric film.

In some implementations, the first electrode is configured to output an output signal to a signal processor in accordance with electric energy generated by the ferroelectric film.

In some implementations, the signal processor is operated using electric power generated by the ferroelectric film.

In some implementations, the signal processor includes a wireless unit that performs wireless communication.

An aspect of the present invention is an electric power supply including the piezoelectric material according to claim 1, which is configured to generate electric power when mechanical force is applied thereto, and one or more electrodes coupled to the piezoelectric material to output the electric power.

A further aspect of the present invention is a method for manufacturing a piezoelectric material. The method includes sintering raw particles containing a ferroelectric, pulverizing a sinter obtained in the sintering to obtain ferroelectric particles, and mixing the ferroelectric particles and an adhesive resin so that the ratio of the ferroelectric particles relative to the total mass of the ferroelectric particles and the adhesive resin is 40 mass % or greater and 90 mass % or less.

In some implementations, an average particle diameter of the ferroelectric particles pulverized in the pulverizing is 2 μm or greater and 10 μm or less.

In some implementations, the sintering is conducted under a sintering temperature that is 1100° C. or greater and 1200° C. or less.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF EMBODIMENTS

[Piezoelectric Material]

Figure 1:
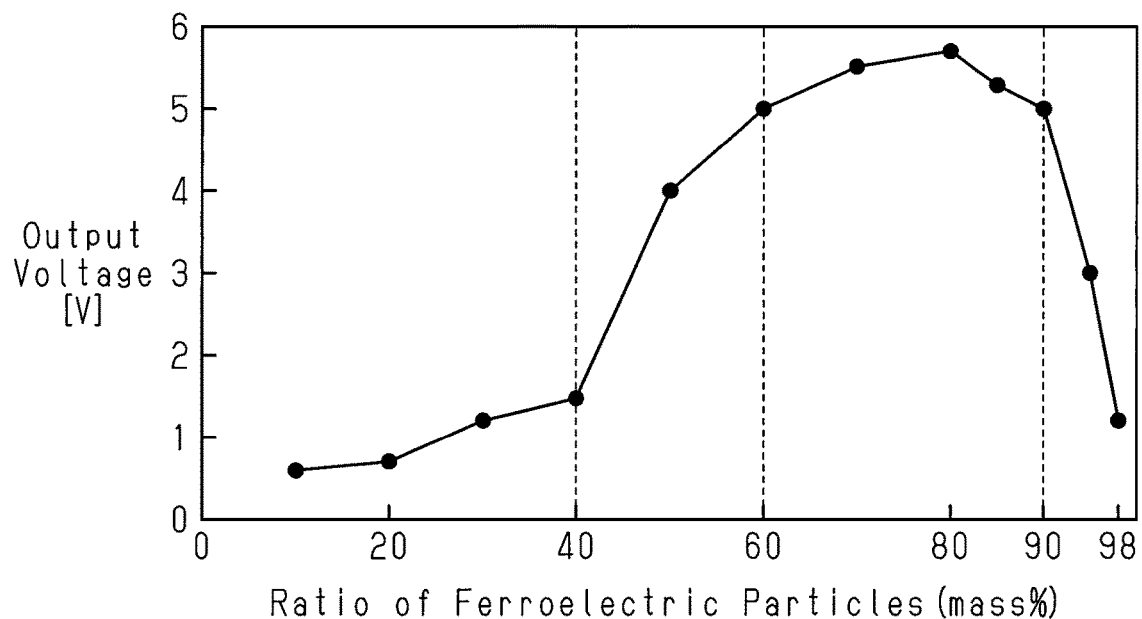
FIG. 1 is a graph showing the relationship of the ratio of ferroelectric particles and the output voltage.

A piezoelectric material is a member in a situation prior to a poling process.

The piezoelectric material contains particles including a ferroelectric (hereafter, referred to as ferroelectric particles) and an adhesive resin.

The ferroelectric particles are obtained by pulverizing a ferroelectric sinter.

Examples of the ferroelectric include, for example, lead zirconate titanate, barium titanate, and strontium titanate. The piezoelectric material contains ferroelectric particles including at least one of these ferroelectrics. In particular, the piezoelectric material contains ferroelectric particles including lead zirconate titanate.

To stabilize the output voltage of the piezoelectric material, it is preferred that ferroelectric particles be uniformly dispersed in the ferroelectric material. This is because non-uniform dispersion of the ferroelectric particles increases the amplitude of output voltage resulting from changes in how force is applied to the piezoelectric material (direction and location of force applied to piezoelectric material).

Preferably, the average particle diameter of the ferroelectric particles is greater than or equal to 2 μm and less than or equal to 10 μm. When the average particle diameter of the ferroelectric particles is less than 2 μm, the piezoelectric characteristics deteriorate. When the average particle diameter of the ferroelectric particles is greater than 10 μm, the adhesion force decreases between the ferroelectric particles and the adhesion resin.

The average particle diameter is a median size, D50. For ferroelectric particles existing along any line segment extending along a cross-section of the piezoelectric material, for example, the diameter of a ferroelectric particle is measured as the length of the particle along the line segment.

Examples of the adhesive resin include an epoxy resin, an acrylic resin, a modified imide resin, a polyimide resin, and a polyamide resin. Further, either one of an ultraviolet curing resin or a thermosetting resin may also be used.

The piezoelectric material may have a thickness that is predetermined so that the physical strength, sensitivity, and output voltage of the piezoelectric material are balanced in a satisfactory manner. The preferred thickness of the piezoelectric material is greater than or equal to 20 μm and less than or equal to 200 μm.

The piezoelectric material may be adhered or fixed to a work piece to detect strain or stress generated in the work piece by external force. When the thickness of the piezoelectric material is less than 20 μm, the piezoelectric material may be torn by the force transmitted to the piezoelectric material from the work piece.

It is preferred that the thickness of the piezoelectric material be large to increase the output voltage of the piezoelectric sensor that uses the piezoelectric material. However, the following problem occurs when the thickness of the piezoelectric material is too large.

When the thickness of the piezoelectric material is greater than 200 μm, the rigidity of the piezoelectric material becomes high. In this case, force that is repetitively applied to the piezoelectric material may form a gap between the ferroelectric particles and the adhesive resin and increase the number and volume of voids in the piezoelectric material. This may lower the moisture resistance of the piezoelectric material. Accordingly, it is preferred that the thickness of the piezoelectric material be 200 μm or less.

In the piezoelectric material, it is preferred that the lower limit value of the ratio of the ferroelectric particles relative to the total mass of the ferroelectric particles and the adhesive resin (hereafter, referred to as "the ratio of ferroelectric particles") be selected to be 40 mass % or greater and further preferred to be selected to be 60 mass % or greater. It is preferred that the upper limit value ratio of ferroelectric particles be selected to be 98 mass % or less, more preferred to be selected to be 90 mass % or less and further preferred to be selected to be 80 mass % or less. The ratio of ferroelectric particles may be selected from any combination of these upper and lower limits.

The relationship of the ratio of ferroelectric particles and the output voltage will now be described with reference to FIG. 1.

Samples having various ratios of ferroelectric particles were prepared to find a preferred ratio of ferroelectric particles. Each sample was formed by sequentially stacking an insulation film having a thickness of 30 µm, a first electrode having a thickness of 3 µm, a ferroelectric film (piezoelectric material) having a thickness of 100 µm, and a second electrode having a thickness of 3 µm on a SUS plate having a width of 5 mm, a length of 30 mm, and a thickness of 1 mm. The insulation film was formed from alumina. Screen printing was performed to form the first electrode and the second electrode. The ferroelectric film was formed from a piezoelectric material paste obtained by mixing the ferroelectric particles and the epoxy resin so that the content rate of lead zirconate titanate is the desired mass ratio.

The ratio of ferroelectric particles varies in the range of 10 mass % to 98 mass %.

A poling process was performed on the ferroelectric film under room temperature, an electrolyte strength of 1 kV/cm, and an application time of 3 minutes.

The output voltage was measured by applying a predetermined load to each sample with a three-point bending tester. More specifically, the distance between support points supporting the sample was set to 25 mm. A load of 0.98 N (100 gf) was applied to the sample at the median point between the support points. Under this situation, the maximum output voltage was measured, and the maximum output voltage was plotted as a representative value of the output voltage for the sample on FIG. 1.

As apparent from FIG. 1, the output voltage becomes high when the ratio of ferroelectric particles is 40 mass % or greater and 98 mass % or less compared to when the ratio of ferroelectric particles is less than 40 mass %. When the ratio of ferroelectric particles is in the range of 40 mass % or greater and 50 mass % or less, the increase rate of the output voltage relative to the increase rate of the ratio of ferroelectric particles is significantly large.

When the ratio of ferroelectric particles is in the range of 50 mass % or greater and 90 mass % or less, in particular, when the ratio of ferroelectric particles is in the range of 60 mass % or greater and 90 mass % or less, the output voltage is maintained at a high level. Further, the changing rate of the output voltage is small relative to changes in the ratio of ferroelectric particles.

Accordingly, when the ratio of ferroelectric particles is in the range of 60 mass % or greater and 90 mass % or less, even if the ratio of ferroelectric particles differs between ferroelectric films due to manufacturing errors, the output voltage subtly varies between the ferroelectric films. Thus, the desired or satisfactory output voltage may be obtained.

The ratio of ferroelectric particles is correlated with the quantity of ferroelectric particles per unit volume in the ferroelectric film (hereafter, referred to as "the number density of ferroelectric particles"). Thus, it can be considered that the characteristics of the output voltage relative to the number density of the ferroelectric particles are similar to the characteristics illustrated in FIG. 1. More specifically, when the number density of the ferroelectric particles in the ferroelectric film is in a range corresponding to the ratio of ferroelectric particles of 40 mass % to 50 mass % (hereafter, this range is referred to as the "specific density range"), the increase rate of the output voltage becomes significantly large relative to the increase rate of the number density of the ferroelectric particles.

The ferroelectric particles in the ferroelectric film have a biased distribution, and the number density of the ferroelectric particles is not uniform. When the number density of the ferroelectric particles in the ferroelectric film varies outside the specific density range, the output voltage substantially varies subtly in the ferroelectric film. However, when the number density of the ferroelectric particles in the ferroelectric film varies in the specific density range, the output voltage substantially varies greatly in the ferroelectric film. Variations of the output voltage in the ferroelectric film would greatly change the output voltage with even a slight change in the direction in which load is applied to the ferroelectric film. Thus, stable output voltage cannot be obtained for the load. From such a viewpoint, it is preferred that the number density of the ferroelectric particles be set outside the specific density range. More specifically, it is preferred that the ratio of ferroelectric particles be set outside 40 mass % to 50 mass %.

It is not known what causes the characteristics illustrated in FIG. 1, that is, the output voltage of the piezoelectric element drastically differing from the ratio of ferroelectric particles of 40 mass %. However, it is considered that an increase in the density of the ferroelectric particles (increase in the number density of the ferroelectric particles) causes a mutual effect of ferroelectrics between the ferroelectric particles, and the mutual effect improves the piezoelectric characteristics of the piezoelectric element.

The relationship of the ratio of ferroelectric particles and the adhesion strength will now be described with reference to FIG. 2.

Figure 2:
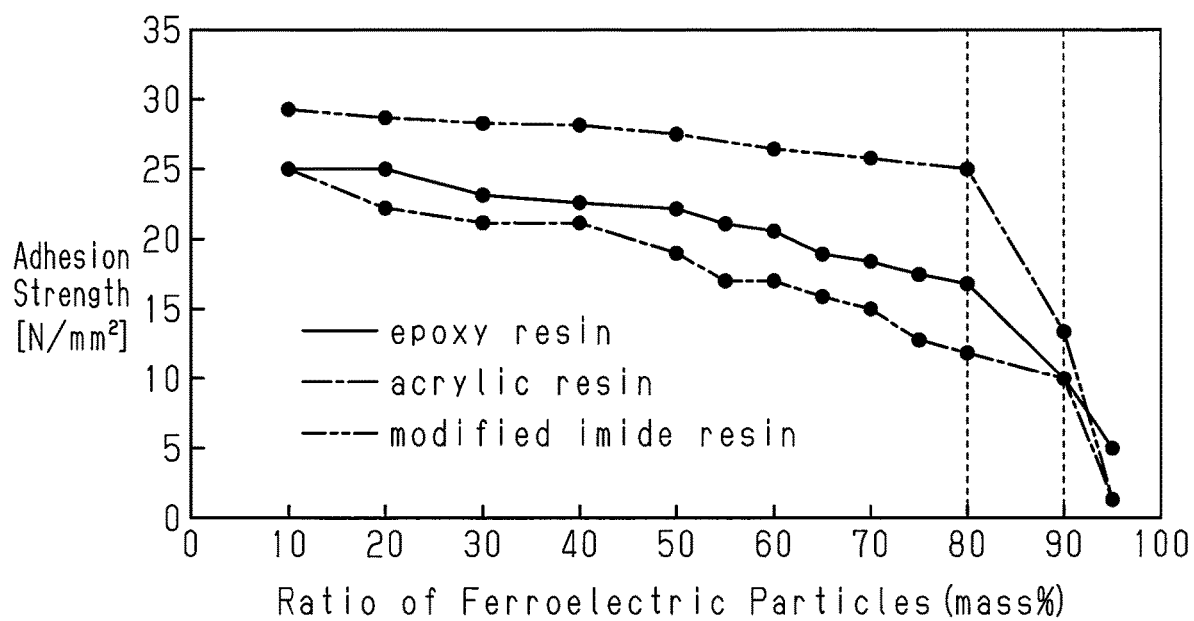
FIG. 2 is a graph showing the relationship of the ratio of ferroelectric particles and the adhesion strength.

The three characteristic curves in FIG. 2 respectively correspond to three types of piezoelectric materials containing different types of adhesive resins. The solid line in FIG. 2 illustrates measurement values of a piezoelectric material prepared using an epoxy resin as the adhesive resin. The single-dashed line in FIG. 2 illustrates measurement values of a piezoelectric material prepared using an acrylic resin as the adhesive resin. The double-dashed line in FIG. 2 illustrates measurement values of a piezoelectric material prepared using a modified imide resin as the adhesive resin.

The adhesion strength was measured by conducting a delamination test. The specimens used in the delamination test were adjusted in the following manner. First, a piezoelectric paste (paste obtained in mixing step described later) was applied to a stainless support plate to form a piezoelectric material layer, and the piezoelectric material layer was dried and heated to prepare a specimen. The ratio of ferroelectric particles in the piezoelectric material paste was changed from 10 mass % to 95 mass % to check the adhesion strength for each ratio. The average particle diameter of the lead zirconate titanate used in the experiment had a D50 value of 4 µm. The dried and heated piezoelectric material layer had a thickness of approximately 100 µm and a size of 5 mm×5 mm. In the delamination test, a wire was attached with an adhesive agent to the upper surface of the piezoelectric material layer and pulled with a gauge (measurement tool) to measure the tensile strength (adhesion strength) when delamination of the piezoelectric material layer from the support plate started. When pulling the wire with the gauge, the wire was pulled in a direction orthogonal to the surface where the support plate and the piezoelectric material layer were adhered.

As shown in FIG. 2, the adhesion strength of the piezoelectric material layer differs in accordance with the type of the adhesive resin and becomes high in the order of acrylic resin, epoxy resin, and modified imide resin.

In any one of these resins, the adhesion strength has a tendency of decreasing when the ratio of ferroelectric particles becomes greater than 80 mass %. Further, when the ratio of ferroelectric particles is greater than 90 mass %, the adhesion strength becomes less than or equal to one half of the maximum strength (highest adhesion strength at each ratio). It is considered that this is because the area occupied by the adhesive agent in the surface of contact between the piezoelectric material layer (molded product of piezoelectric material paste) and the support plate increases as the ratio of ferroelectric particles becomes higher.

As shown in FIG. 2, it is preferred that modified imide be used as the adhesive resin. Further, it is preferred that the ratio of ferroelectric particles be less than or equal to 90 mass %, and further preferred that the ratio of ferroelectric particles be less than or equal to 80 mass %.

The main effects of the piezoelectric material in the present embodiment will now be described.

It is preferred that the ratio of ferroelectric particles be 40 mass % or greater and 98 mass % or less. In this configuration, the output voltage of the piezoelectric sensor including the piezoelectric material is higher than a piezoelectric sensor including a piezoelectric material in which the ratio of ferroelectric particles is less than 40 mass %. It is particularly preferred that the ratio of ferroelectric particles be 60 mass % or greater and 90 mass % or less. This configuration remarkably increases the output voltage of the piezoelectric sensor including the piezoelectric material.

In the piezoelectric material, it is preferred that the ratio of ferroelectric particles be 90 mass % or less, and further preferred that the ratio of ferroelectric particles be 80 mass % or less. This results in the adhesion strength of the piezoelectric material being greater than a piezoelectric material in which the ratio of ferroelectric particles is greater than 90 mass %.

[Method for Manufacturing Piezoelectric Material]

A method for manufacturing the piezoelectric material includes a preprocessing step, a sintering step, a pulverizing step, a mixing step, a molding step, and a hardening step.

In the preprocessing step, a mixture of raw particles containing a ferroelectric (piezoelectric material) and a binder resin is molded into a green sheet with a pressing machine or the like and then undergoes a debinding process. The ferroelectric contained in the raw particles may be zirconate titanate, barium titanate, strontium titanate, or the like.

In the sintering process, the green sheet, which has undergone the debinding process, is sintered.

The preferred sintering temperature is 1100° C. or greater and 1200° C. or less. This is because it becomes difficult for a sintering reaction to occur when the sintering temperature is less than 1100° C., and the density of the sinter decreases when the sintering temperature is higher than 1200° C.

In the pulverizing step, the sinter obtained in the sintering step is pulverized to obtain ferroelectric particles (ferroelectric powder). For example, the sinter is pulverized with a ball mill using ceramic beads so that the average particle diameter of ferroelectric particles is in the range of 2 μm or greater and 10 μm or less. The ceramic beads may be zirconia beads ($Zr_2O_3$ beads).

In the mixing step, the ferroelectric particles (ferroelectric powder) and the adhesive resin are mixed. The mixing sets the ratio of ferroelectric particles to the predetermined ratio of 40 mass % or greater and 98 mass % or less. It is further preferred that the ratio of ferroelectric particles be 60 mass % or greater and 90 mass % or less.

The molding step forms a molded product of the piezoelectric material paste obtained in the mixing step. For example, the piezoelectric paste is molded to have a predetermined shape (e.g., film, sheet, cuboid, or cylinder) by performing screen printing, applying the piezoelectric material paste with a blade, or charging a mold with the piezoelectric material.

In the hardening step, the molded product obtained in the molding process is hardened. The hardening hardens the adhesive resin through a process that is in accordance with the type the adhesive resin.

For example, when the adhesive resin has thermosetting characteristics, the adhesive resin is heated and hardened. When the adhesive resin has light curing characteristics, the adhesive resin is irradiated with ultraviolet rays and hardened.

[Piezoelectric Sensor]

The piezoelectric sensor includes the piezoelectric material described above and two electrodes (first electrode and second electrode) located on opposite surfaces of the piezoelectric material. One of the electrodes may be divided into a plurality of segments. For example, one of the electrodes may be formed by a plurality of output electrodes.

The piezoelectric sensor is obtained by performing a poling process (electrode-dividing process) on the piezoelectric material to which the two electrodes are added.

The electrodes may be formed from, for example, a conductive metal material such as copper, silver, a silver-palladium alloy, nickel, aluminum, gold, or platinum.

The piezoelectric sensor has the advantages described below.

The piezoelectric material of the piezoelectric sensor is set so that the ratio of ferroelectric particles is 40 mass % or greater. Such a piezoelectric sensor outputs a high output voltage (refer to FIG. 1) as compared with when the ratio is 40 mass % or less. Thus, the S/N ratio of the piezoelectric sensor is improved. In an output signal output from the piezoelectric sensor, the S/N ratio refers to the ratio of the output signal, which is output when mechanical strain is applied to a crankshaft body, and noise.

The piezoelectric sensor has a high output (e.g., 2 V or higher in FIG. 1) and thus may be used as a power supply for operating other electronic devices. That is, the piezoelectric sensor may be used as a power generator that converts the force depressing a bicycle pedal to electric power.

[Bicycle Crankshaft]

Figure 3:
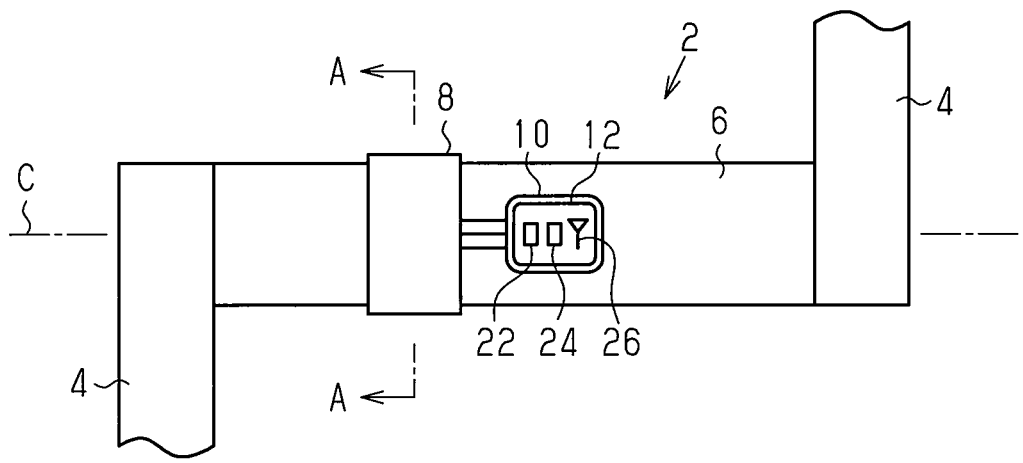
FIG. 3 is a schematic diagram of a bicycle crankshaft including a piezoelectric sensor.
Figure 5:
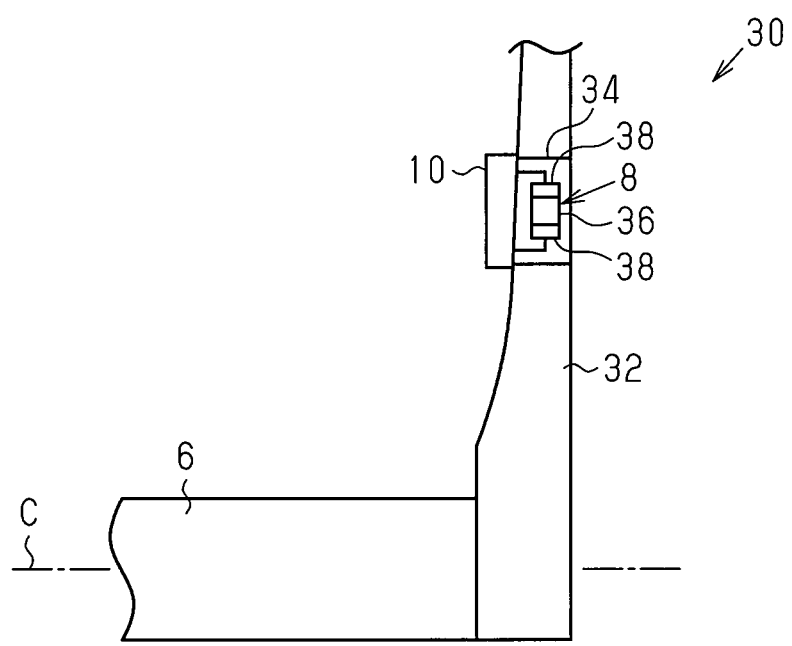
FIG. 5 is a schematic diagram of a bicycle crank arm including a piezoelectric sensor.

One example of a bicycle crankshaft 2 will now be described with reference to FIGS. 3 and 4A. Arm bodies 4 of crank arms are coupled to the two ends of the bicycle crankshaft 2 shown in FIG. 3. The bicycle crankshaft 2 is configured to be a part of a bicycle component.

The bicycle crankshaft 2 includes a crankshaft body 6, having a rotation axis C, a piezoelectric sensor 8, and a signal processor 10 that processes output signals output from the piezoelectric sensor 8. The crankshaft body 6 is one example of a main body of a bicycle component.

Figure 4A:
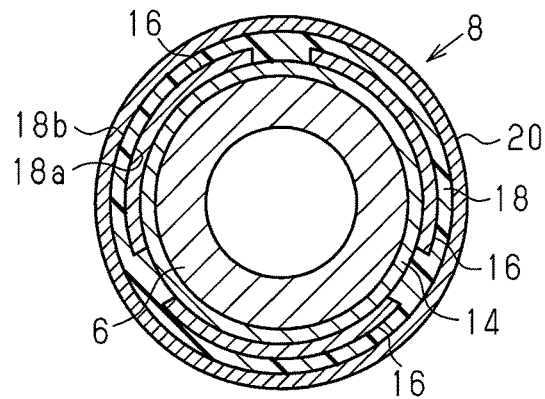
FIG. 4A is a cross-sectional view of the crankshaft taken along line A-A in FIG. 3.

As shown in FIG. 4A, the piezoelectric sensor 8 includes an insulation film 14 that covers the crankshaft body 6, a plurality of output electrodes 16 (first electrodes), a ferroelectric film 18, and a common electrode 20 (second electrode) that covers the ferroelectric film 18. The common electrode 20 is connected to ground (e.g., crankshaft body 6).

The insulation film 14 is formed from, for example, alumina or the like. The insulation film 14 is formed to have a thickness of 20 μm to 50 μm.

The output electrodes 16 (first electrodes) and the common electrode 20 (second electrode) are formed from copper, silver, a silver-palladium alloy, nickel, aluminum, gold, or platinum. The output electrodes 16 are formed by performing, for example, screen printing or sputtering. When sputtering is performed, the electrodes are formed to have a thickness of 50 nm to 100 nm.

The output electrodes 16 are spaced apart by gaps from one another and arranged around the rotation axis C on the insulation film 14. The example shown in FIG. 4A includes three output electrodes 16. However, there may be any number of output electrodes. The output electrodes 16 are each configured to output an output signal to the signal processor 10 in accordance with the electric energy generated by the ferroelectric film 18. The group of the output electrodes 16 of FIG. 4A may be referred to as an inner electrode. Each of the output electrodes 16 of FIG. 4A may be referred to as an inner sub-electrode. The common electrode 20 may be referred to as an outer electrode.

The ferroelectric film 18 covers the output electrodes 16. The gaps between adjacent output electrodes 16 (grooves between output electrodes 16) are filled by the ferroelectric film 18.

For example, the ferroelectric film 18 includes an inner surface 18a and an outer surface 18b that are substantially parallel to the rotation axis C of the crankshaft body 6. The output electrodes 16 are in close contact with the inner surface 18a of the ferroelectric film 18, and the common electrode 20 is in close contact with the outer surface 18b of the ferroelectric film 18.

The ferroelectric film 18 includes the ferroelectric particles and the adhesive resin. It is preferred that the ratio of ferroelectric particles be 40 mass % or greater and further preferred that the ratio of ferroelectric particles be 60 mass % or greater. Additionally, it is preferred that the ratio of ferroelectric particles be 98 mass % or less, more preferred to be selected to be 90 mass % or less and further preferred that the ratio of ferroelectric particles be 80 mass % or less.

The signal processor 10 is operated by the power of the output signal. That is, the piezoelectric sensor 8 also functions as a power supply for the signal processor 10. The signal processor 10 includes a wireless unit 12. The wireless unit 12 establishes wireless communication with a bicycle information processor to transmit the output signal of the piezoelectric sensor 8 to the bicycle information processor. The bicycle information processor may be, for example, a calculator that calculates the depression force of the pedal based on the stress applied to the bicycle crankshaft 2 or a calculator that calculates an assist force for a power-assisted bicycle based on the stress.

The wireless unit 12 includes a signal formation circuit, which converts at least the output signal of the piezoelectric sensor 8 to a transmission signal, a communication circuit 24, which controls communication, and an antenna 26, which transmits the transmission signal.

The bicycle crankshaft 2 is operated in the following manner.

When the bicycle crankshaft 2 is rotated by the force depressing a bicycle pedal, mechanical strain (e.g., torsional stress) is generated at the crankshaft body 6. The ferroelectric film 18 generates electric energy in accordance with the mechanical strain generated at the crankshaft body 6. The piezoelectric sensor 8 outputs an output signal from the output electrodes 16 to the wireless unit 12 in accordance with the electric energy. The output signal is transmitted to the bicycle information processor by the wireless unit 12.

The bicycle crankshaft 2 includes the piezoelectric sensor 8 that includes the ferroelectric film 18 (piezoelectric material) in which the ratio of ferroelectric particles is 40 mass % or greater. Thus, high output is obtained from the mechanical strain.

Figure 4B:
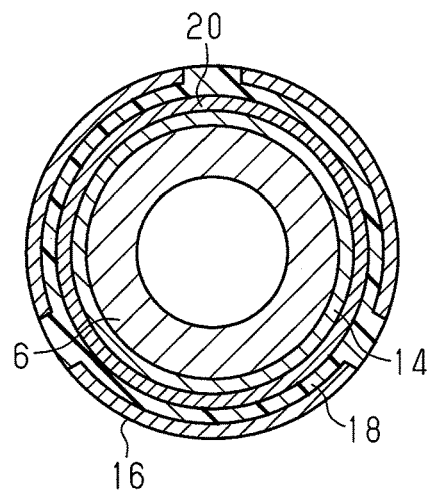
FIGS. 4B and 4C show cross-sectional views of bicycle crankshafts according to modified examples.

In a modified example of FIG. 4B, the common electrode 20 is formed on the insulation film 14 that covers the crankshaft body 6. The ferroelectric film 18 is formed on the common electrode 20. The output electrodes 16 are formed on the outer surface 18b of the ferroelectric film 18. The output electrodes 16 may be covered by an insulative encapsulation resin. In the modified example of FIG. 4B, the output electrodes 16 are positioned closer to the outermost surface of the piezoelectric sensor 8. This may facilitate electric connection between the output electrodes 16 and the signal processor 10. The common electrode 20 may be referred to as an inner electrode. The group of the output electrodes 16 of FIG. 4B may be referred to as an outer electrode. Each of the output electrodes 16 of FIG. 4B may be referred to as an outer sub-electrode.

Figure 4C:
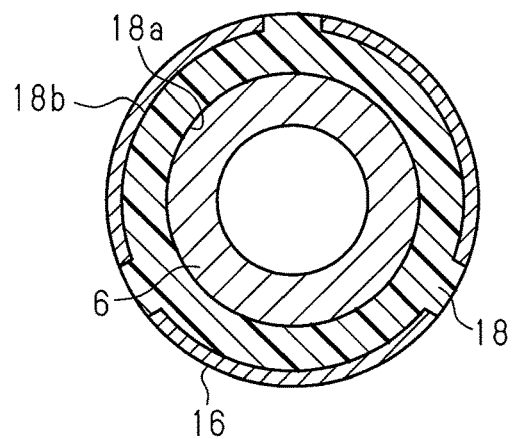

The insulation film 14 and the common electrode 20 may be omitted. For example, as shown in FIG. 4C, the ferroelectric film 18 covers the crankshaft body 6. The output electrodes 16 are formed on the outer surface 18b of the ferroelectric film 18. The inner surface 18a of the ferroelectric film 18 serves as a coupling surface to the crankshaft body 6. The crankshaft 2, which may be made of a conductive material such as metal, has a role of a common electrode.

[Bicycle Crank Arm]

One example of a bicycle crank arm 30 will now be described. The bicycle arm 30 is configured to be a part of a bicycle component.

The bicycle crank arm 30 includes an arm body 32, a piezoelectric sensor 8, and a signal processor 10. The signal processor 10 includes a wireless unit 12. The signal processor 10 is located at the inner side of the arm body 32 (side at which the crankshaft body 6 is located). The signal processor 10 includes a wireless unit 12. The arm body 32 is one example of a main body of a bicycle component.

The piezoelectric sensor 8 includes an insulation film 34, which is formed on the surface of the arm body 32, and two electrodes 38 (first electrode and second electrode) physically and electrically coupled to two ends of the ferroelectric film 36. The two electrodes 38 and the ferroelectric film 36 are located on the insulation film 34. It is preferred that the ratio of ferroelectric particles in the ferroelectric film 36 be set in the same manner as the ferroelectric film 18.

The bicycle crank arm 30 is operated in the following manner.

When the bicycle crank arm 30 is rotated by the force depressing a bicycle pedal, mechanical strain (e.g., bending stress) is generated at the arm body 32. The ferroelectric film 36 of the piezoelectric sensor 8 generates electric energy in accordance with the mechanical strain generated at the arm body 32. The piezoelectric sensor 8 outputs an output signal through the wireless unit 12 in accordance with the electric energy. The output signal is transmitted to the bicycle information processor by the wireless unit 12.

The bicycle crank arm 30 includes, on the arm body 32, the piezoelectric sensor 8 that includes the ferroelectric film 36 (piezoelectric material) in which the ratio of ferroelectric particles is 40 mass % or greater. Thus, high output is obtained from the mechanical strain.

[Method for Manufacturing Bicycle Crankshaft]

A method for manufacturing the piezoelectric sensor 8, which is arranged on a crankshaft, will now be described with reference to FIG. 6. FIGS. 6A to 6F are cross-sectional views taken along line A-A in FIG. 3.

Figure 6A:
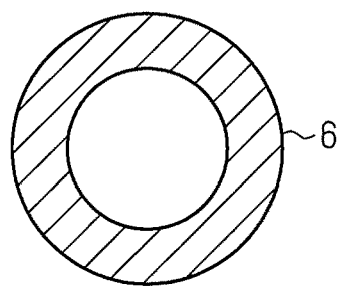
FIGS. 6A to 6F are schematic diagrams illustrating a method for manufacturing a bicycle crankshaft including a piezoelectric sensor.
Figure 6B:
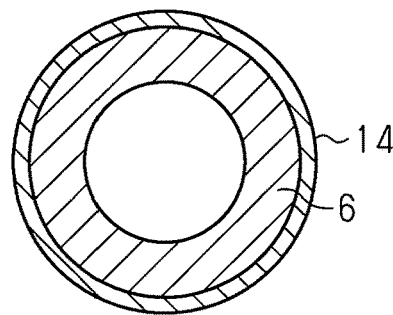

FIG. 6A is a cross-sectional view of the crankshaft body 6. When forming the piezoelectric sensor 8, the insulation film 14 is formed around the rotation axis C of the crankshaft body 6 as shown in FIG. 6B. The insulation film 14 is formed from a non-conductive substance such as alumina or ceramics. It is preferred that the insulation film 14 be thin.

The insulation film 14 may be, for example, formed in a CVD film formation process, formed by a ceramic adhesive, or formed through screen printing. The CVD film formation process would allow for the formation of a film having a uniform thickness. The ceramic adhesive would allow the insulation film 14 to be easily formed by undergoing curved surface printing.

Figure 6C:
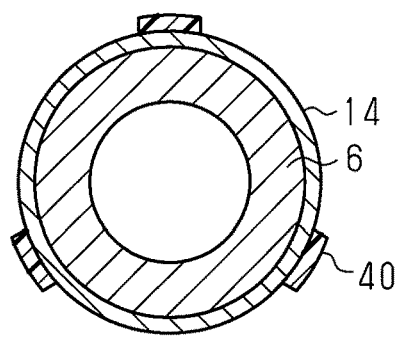
Figure 6D:
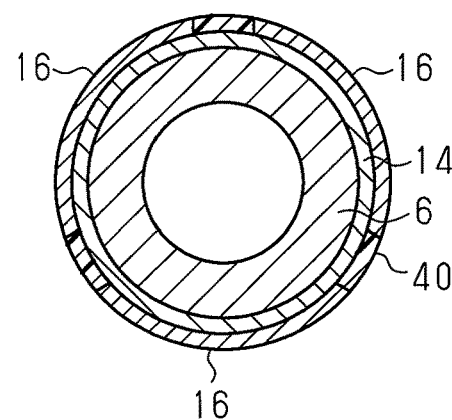

Then, as shown in FIG. 6C, a mask 40 is applied to the insulation film 14 at portions other than where the output electrodes 16 are formed. Further, as shown in FIG. 6D, a conductive paste is applied and thermally hardened to form the output electrodes. The conductive paste contains at least one selected from a group of copper particles, silver particles, silver-palladium alloy particles, nickel particles, gold particles, and platinum particles. The output electrodes 16 may also be formed by performing sputtering.

Figure 6E:
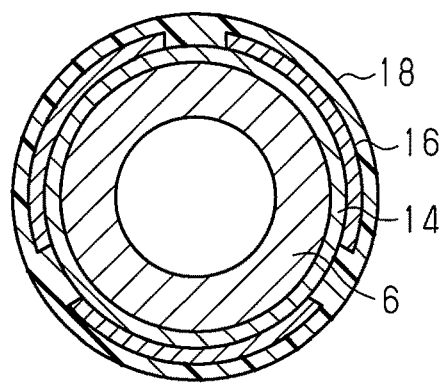
Figure 6F:
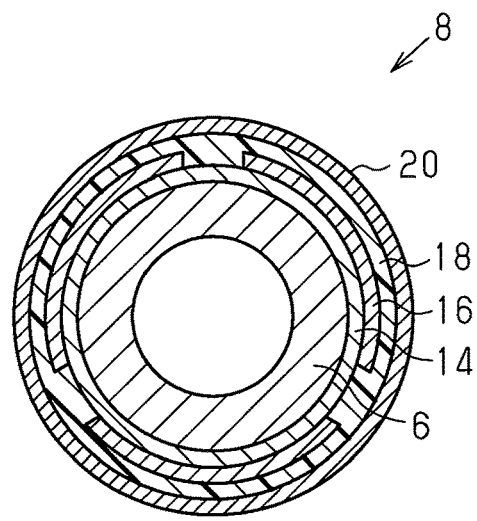

As shown in FIG. 6E, after removing the mask 40, a piezoelectric material paste is applied to form the ferroelectric film 18. In the piezoelectric material paste, the ratio of ferroelectric particles is 40 mass % or greater and 90 mass % or less. The piezoelectric paste is hardened to form the ferroelectric film 18. Then, as shown in FIG. 6F, the common electrode 20 is formed covering the ferroelectric film 18. The common electrode 20 is formed by applying or sputtering a conductive paste or performing the like. Although not shown in the drawings, it is preferred that the piezoelectric sensor 8, which is formed in this manner, be entirely covered by an insulative encapsulation resin. The encapsulation resin is formed in the same manner as the insulation film 14.

In the manufacturing method described above, the insulation film 14, the output electrodes 16, the ferroelectric film 18, the common electrode 20, and the encapsulation resin are sequentially stacked on the crankshaft body 6. The ferroelectric film 18 is located between the output electrodes 16 and the common electrode 20. The output electrodes 16 and the common electrode 20 may be located on only one of the surfaces in the thickness direction of the ferroelectric film 18. In this case, the output electrodes 16 and the common electrode 20 are both located between the insulation film 14 and the ferroelectric film 18. Alternatively, the output electrodes 16 and the common electrode 20 are both located between the ferroelectric film 18 and the encapsulation resin.

The manufacturing method described above does not include a bending step. Thus, residual stress that accumulates in the piezoelectric sensor 8 is either null or small. This limits delamination, which would result from residual stress, between the ferroelectric film 18 and the output electrodes 16 and between the ferroelectric film 18 and the common electrode 20.

In the manufacturing method of the piezoelectric sensor 8, for example, a sheet-like piezoelectric sensor 8 may be formed and adhered to the crankshaft body 6. In this case, the output electrodes 16, the ferroelectric film 18, the common electrode 20, and an insulation film are sequentially stacked on a resin film to form the sheet-like piezoelectric sensor 8. Then, the sheet-like piezoelectric sensor 8 and the crankshaft body 6 are adhered to each other with an adhesive material. It is preferred that the resin film be formed from a heat-resistant and insulative resin, for example, a polyimide resin. When forming the resin film from a heat-resistant and insulative resin, the output electrodes 16, the ferroelectric film 18, and the common electrode 20 may be formed in the same manner as described above.

[Bicycle Pedal Shaft]

One example of a bicycle pedal shaft (hereafter, referred to as "the pedal shaft 52") will now be described with reference to FIGS. 7A and 7B. The bicycle pedal 50 includes a pedal shaft 52 and a pedal body 54, which is rotatable about the axis of the pedal shaft 52. The bicycle pedal 50 is a bicycle component. The pedal shaft 52 is configured to be a part of a bicycle component.

Figure 7A:
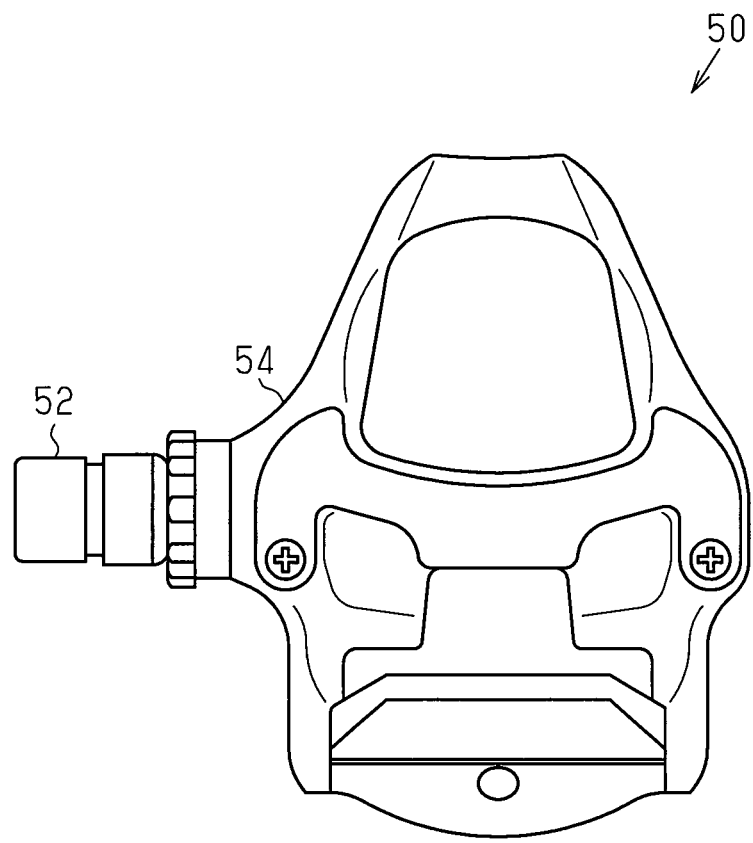
FIG. 7A is a plan view of a bicycle pedal provided with a piezoelectric sensor.
Figure 7B:
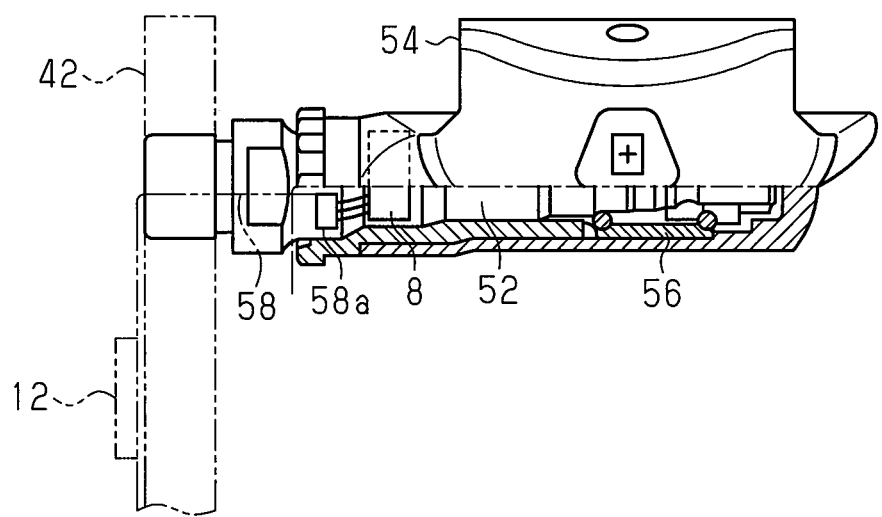
FIG. 7B is a partially cutaway side view of the bicycle pedal.

The bicycle pedal 50 shown in FIGS. 7A and 7B is a so-called clipless pedal. The pedal body 54 includes a holding mechanism that holds a cleat, which is arranged on a shoe, in a removable manner. A bearing 56 is located between the pedal shaft 52 and the pedal body 54. In the same manner as the crankshaft 2 described above, the piezoelectric sensor 8 is arranged on the pedal shaft 52. The manufacturing method of the piezoelectric sensor 8 is similar to that of the crankshaft described above. The piezoelectric sensor 8 is arranged on the pedal shaft 52, for example, between the end to which the crank arm 42 is coupled and the portion of the pedal shaft 52 supporting the pedal body 54. The signal processor 10 is arranged on the crank arm 42. The signal processor 10 is connected to the piezoelectric sensor 8 by a wire 58 and a wire plate 58a, which extend through a cavity formed in the pedal shaft 52 and a hole in the crank arm 42 used to couple the pedal shaft 52.

[Piezoelectric Sensor Chip]

One example of a piezoelectric sensor chip 60 that is one embodiment of the piezoelectric sensor 8 will now be described with reference to FIGS. 8A to 8C.

The piezoelectric sensor chip 60 basically has the same configuration as the piezoelectric sensor 8 described above. The piezoelectric sensor chip 60 includes a ferroelectric film 18 and a first electrode 62 and a second electrode 64, which are arranged on one of the surfaces of the ferroelectric film 18. The first electrode 62 and the second electrode 64 are respectively formed on one end and the other end of the ferroelectric film 18. The first electrode 62 and the second electrode 64 are each embedded in the ferroelectric film 18, and the surfaces of the first electrode 62 and the second electrode 64 are continuous with the surface of the ferroelectric film 18. The first electrode 62 and the second electrode 64 respectively include electrode portions 66 and 68 extending in the ferroelectric film 18. The electrode portions 66 and 68 are planar. The electrode portions 66 connected to the first electrode 62 are opposed to the electrode portions 68 connected to the second electrode 64 at overlapping positions. The ferroelectric film 18 is located between the electrode portions 66 and 68. As shown in FIG. 8A, the plurality of electrode portions 66 and 68 may be connected to the first electrode 62 and the second electrode 64. In this case, the second portions 66 of the first electrode 62 are arranged to be overlapped with the electrode portions 68 of the second electrode 64.

Figure 8A:
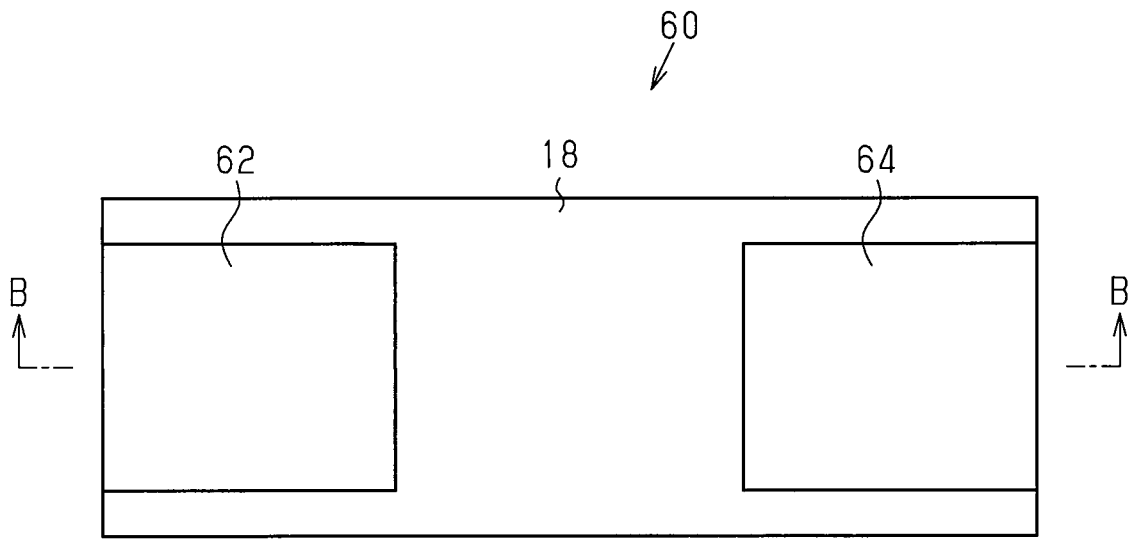
FIG. 8A is a plan view of a piezoelectric sensor chip.
Figure 8B:
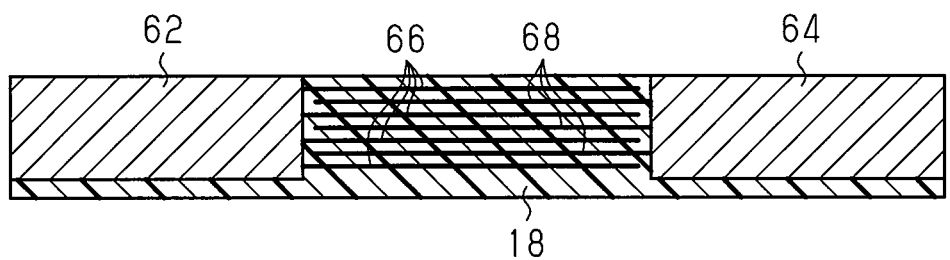
FIG. 8B is a cross-sectional view of a piezoelectric sensor chip taken along line B-B.
Figure 8C:
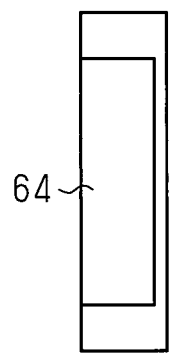
FIG. 8C is a side view of the piezoelectric sensor chip.

Referring to FIGS. 8A to 8C, the piezoelectric sensor chip 60 is a so-called stacked type piezoelectric sensor. The thickness of the ferroelectric film 18 is 20 μm or greater and 50 μm or less. When using the piezoelectric sensor chip 60, the piezoelectric sensor chip 60 is adhered by an adhesive material to a detection subject. When the detection subject is conductive, an insulative adhesive may be used for the adhesion. Alternatively, the adhesion may be performed after forming the insulation film on the detection subject. The first electrode 62 and the second electrode 64 are formed from the same material as the output electrodes 16 and the common electrode 20 described above.

The present invention is not limited to the above-described embodiments (and one or more forms of the embodiments). For example, the embodiments may be modified as described below.

In the embodiments, the configuration of the piezoelectric material is applied to the configuration of the ferroelectric films 18 and 36 of the piezoelectric sensor 8 that detects mechanical strain of the bicycle crankshaft 2 or the bicycle crank arm 30. However, the application range of the configuration of the piezoelectric material in the embodiments is not limited in such a manner. The configuration of the above piezoelectric material may also be applied to a ferroelectric film of a piezoelectric sensor 8 used in an endurance testing machine for a rigid body, a ferroelectric film of a piezoelectric sensor 8 used in an measurement device that measures vibration of an overpass, or the like.

In the embodiments, as described above, the piezoelectric sensor 8 may also be used as a power generator. For example, the piezoelectric sensor 8 that serves as a power generator mounted on a rotational body, such as the bicycle crankshaft 2 or the bicycle crank arm 30, may be connected by a rectification circuit or a rotational coupling connector to a bicycle lamp, a battery, information processors, or the like.

There is no particular limit to the form and size of the piezoelectric sensor 8 in the embodiments. For example, the piezoelectric sensor 8 may be formed to be sheet-like. The sheet-like piezoelectric sensor 8 may be, for example, arranged in an automated ticket booth and be used as a vibration-powered generator.

The piezoelectric sensor is not limited for use with the crankshaft 2, the crank arm 30, or the pedal shaft 52. The piezoelectric sensor may be arranged on or fixedly attached to a shaft body of other bicycle components, such as a frame, a handle, a stem, a hub axle, a hub shell, a spoke, a seat post, and a saddle rail.

It is preferable that the piezoelectric material or the piezoelectric sensor be arranged on or fixedly attached to an article to be sensed, such as the crankshaft 6. However, an adhesive, a tackiness agent and the like may be applied on the piezoelectric material or the piezoelectric sensor to increase the adhesion strength of the piezoelectric material. More specifically, the piezoelectric material may demonstrate poor adhesion strength when the ratio of ferroelectric particles in the piezoelectric material is greater than 90 mass %. In such case, application of the adhesive, tackiness agent and the like on the piezoelectric material or the piezoelectric sensor may compensate for the poor adhesion strength.

It should be apparent to those skilled in the art that the present invention may be embodied in many other specific forms without departing from the spirit or scope of the invention. For example, some of the components may be omitted from the components disclosed in the embodiments (or one or more aspects thereof) or be combined. The scope of the present invention should be determined with reference to the scope and equivalence of the appended claims. Further, the foregoing description uses mass %, which is an SI unit. However, at locations where gravity acts, mass % may be replaced by wt %. This would obtain the same results.

The invention claimed is:

1. A bicycle component comprising:
   a ferroelectric film having power generating characteristics, and
   one or more electrodes at least partially embedded in the ferroelectric film, the ferroelectric film having a first thickness and a second thickness which is different from the first thickness.

2. The bicycle component according to claim 1, wherein the ferroelectric film includes a mixture of ferroelectric particles and an adhesive resin.

3. The bicycle component according to claim 1, wherein a ratio of the ferroelectric particles relative to a total mass of the ferroelectric particles and the adhesive resin in the ferroelectric film is 40 mass % or greater and 98 mass % or less.

4. A bicycle component, comprising:
   an insulation film formed on a surface of a main body of the bicycle component;
   a first electrode formed on the insulation film;
   a ferroelectric film having power generating characteristics and connected to the first electrode; and
   a second electrode connected to the ferroelectric film.

5. A bicycle component, comprising:
   a shaft body;
   an insulation film formed on a surface of the shaft body;
   a plurality of output electrodes spaced apart by gaps from one another and arranged on the insulation film around the shaft body;
   a ferroelectric film having power generating characteristics and connected to the output electrodes, wherein the gaps between adjacent ones of the output electrodes are filled with the ferroelectric film; and
   a common electrode connected to the ferroelectric film.

6. The bicycle component according to claim 5, wherein the shaft body is selected from a group consisting of a crankshaft, a crank arm, a pedal shaft, a frame, a handle, a stem, a hub axle, a hub shell, a spoke, a seat post, and a saddle rail.

7. The bicycle component according to claim 5, wherein the ferroelectric film includes an inner surface and an outer surface that are substantially parallel to the shaft body, and
   the output electrodes are in close contact with the inner surface of the ferroelectric film, and the common electrode is in close contact with the outer surface of the ferroelectric film.

8. The bicycle component according to claim 4, wherein the first electrode is configured to output an output signal to a signal processor in accordance with electric energy generated by the ferroelectric film.

9. The bicycle component according to claim 8, wherein the signal processor is operated using electric power generated by the ferroelectric film.

10. The bicycle component according to claim 8, wherein the signal processor includes a wireless unit that performs wireless communication.

* * * * *